United States Patent [19]

Lau

[11] 3,961,206

[45] June 1, 1976

[54] NON LINEAR NETWORK CONVERTING BIPOLAR SAWTOOTH SIGNAL INTO SINEWAVE SIGNAL

[75] Inventor: Hung Wah Anthony Lau, Fleet, England

[73] Assignee: The Solartron Electronic Group Limited, Farnborough, England

[22] Filed: Aug. 19, 1974

[21] Appl. No.: 498,814

[30] Foreign Application Priority Data

Aug. 21, 1973 United Kingdom............... 39386/73

[52] U.S. Cl............................... 307/261; 307/230; 307/235 T; 307/313; 307/315; 307/317 A
[51] Int. Cl.² ......................................... H03K 6/04
[58] Field of Search .......... 307/230, 235, 261, 313, 307/255, 288, 315, 317

[56] References Cited
UNITED STATES PATENTS

| | | | |
|---|---|---|---|
| 3,636,380 | 1/1972 | Anderson............................ | 307/261 |
| 3,665,215 | 5/1972 | Boronkay............................ | 307/230 |
| 3,787,739 | 1/1974 | Cowpland et al................... | 307/255 |
| 3,821,659 | 6/1974 | Ludwig............................ | 307/261 X |
| 3,868,519 | 2/1975 | Green ............................ | 307/261 X |

*Primary Examiner*—John S. Heyman
*Attorney, Agent, or Firm*—William R. Sherman; Kevin McMahon

[57] ABSTRACT

A symmetrical non-linear network for use in a function generator in which one or other of a pair of transistors is brought progressively into conduction by a non-linear network, so as to present a low dynamic resistance between the terminals. The non-linear network preferably includes a pair of diodes having a lower turn on voltage than that of the associated transistors, for example Schottky diodes with silicon transistors.

The invention also provides a function generator incorporating the above non-linear network for converting square waves to sine waves in which the amplitude of the input signal to the network is controlled automatically.

11 Claims, 3 Drawing Figures

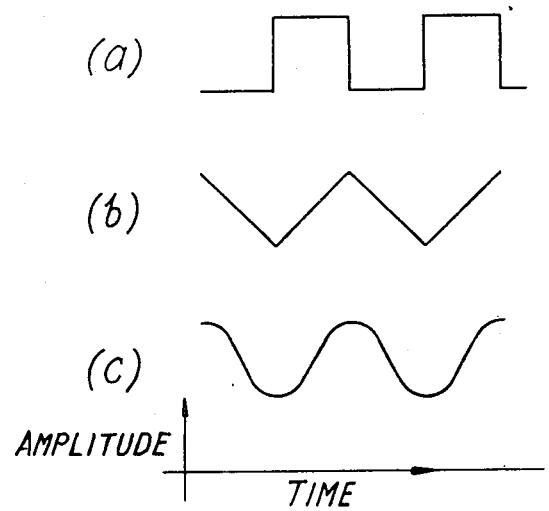
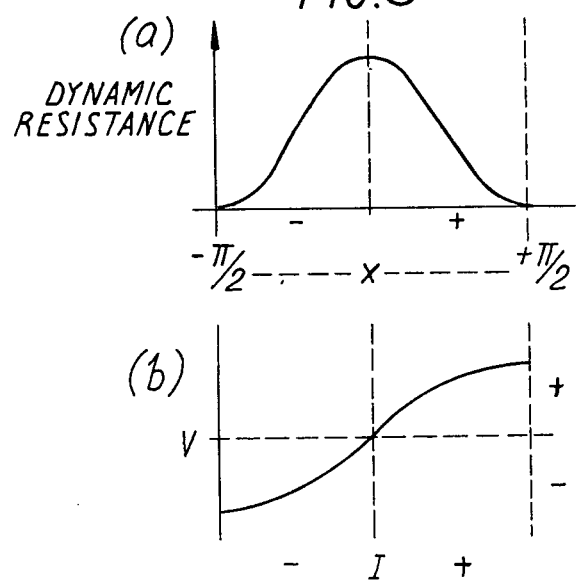

NON LINEAR NETWORK CONVERTING BIPOLAR SAWTOOTH SIGNAL INTO SINEWAVE SIGNAL

This invention relates to non-linear networks and is particularly, but not exclusively, concerned with function generators.

The processes of frequency multiplication, division, mixing, etc. employed in generating stable signals commonly yield a signal having the required fundamental frequency but with a high harmonic content as, for example, a square wave.

Low pass filters have been employed to reduce the harmonic content of such signals but a variable cut-off frequency, such as would be required in a wide range signal generator, is not readily combined with a rapid attenuation above the cut-off frequency.

Alternatively direct shaping of a square wave by means of function generators is known but these methods have generally employed operational amplifiers and so have been limited to frequencies below 100kHz by considerations of phasing. Typically a square wave is integrated by an integrator to yield a triangualr waveform which is then shaped by means of a diode function generator.

However, known diode function generators do not provide the wide range of slope of the transfer function characteristic needed to avoid discontinuities on peaks of the output waveform. Unless the slope of the transfer characteristic is very small at the limits of its range compared with its mid-range value, any discontinuity at the limits of the input waveform will result in a discontinuity at the limits of the output waveform. A triangular wave will, for example, yield a sine wave having pointed rather than rounded peaks.

It is also important that the peak to peak amplitude of the input signal to a function generator should reach, but not overshoot, the limits of its range if the required shaping, without for example excessive flattening of the peaks of a sine wave, is to be achieved.

With these problems in mind there is provided according to the invention a non-linear network for use in a function generator comprising respective first and second terminals first and second transistors disposed in parallel circuit paths between the two terminals, first and second non-linear circuits respectively connected between base and collector of each respective transistor so that one or other of said transistors becomes progressively more conductive as the absolute value of an imput signal applied between the two terminals exceeds a predetermined magnitude whereby the dynamic resistance presented by the network is progressively reduced.

The invention also provides a function generator for converting square waves to sine waves comprising integrating means for converting a square wave input signal to a triangular wave signal, a non-linear network as described, and means for applying the triangular signal to the non-linear network to yield a sinusoidal output signal wherein the integrating means comprises an integrating capacitor connected to receive current pulses from a switching transistor which is switched by the square wave input signal, a source of reference signal and a feedback circuit adapted to receive a signal representative of the amplitude of the triangular wave signal and the reference signal, and to provide an output for adjusting the amplitude of current pulses supplied by the switching transistor so as to maintain substantially constant the amplitude of the triangular wave signal. Advantageously, the amplitude of the current pulses supplied by the switching transistor is varied by varying the bias on the transistor. Desirably, the integrating means further comprises temperature responsive means whereby the amplitude of the triangualar wave signal may be adjusted according to temperature so as to compensate for variations with temperature of the dynamic resistance presented by the network.

The invention will now be described by way of non-limitative example only by reference to the attached drawings in which FIG. 1 shows a square to sine wave function generator according to one aspect of this invention incorporating a non-linear network in accordance with another aspect of the invention.

FIG. 2 shows waveforms at various points in the function generator of FIG. 1.

FIG. 3 shows the characteristics of the non-linear network of FIG. 1.

Figure 1:
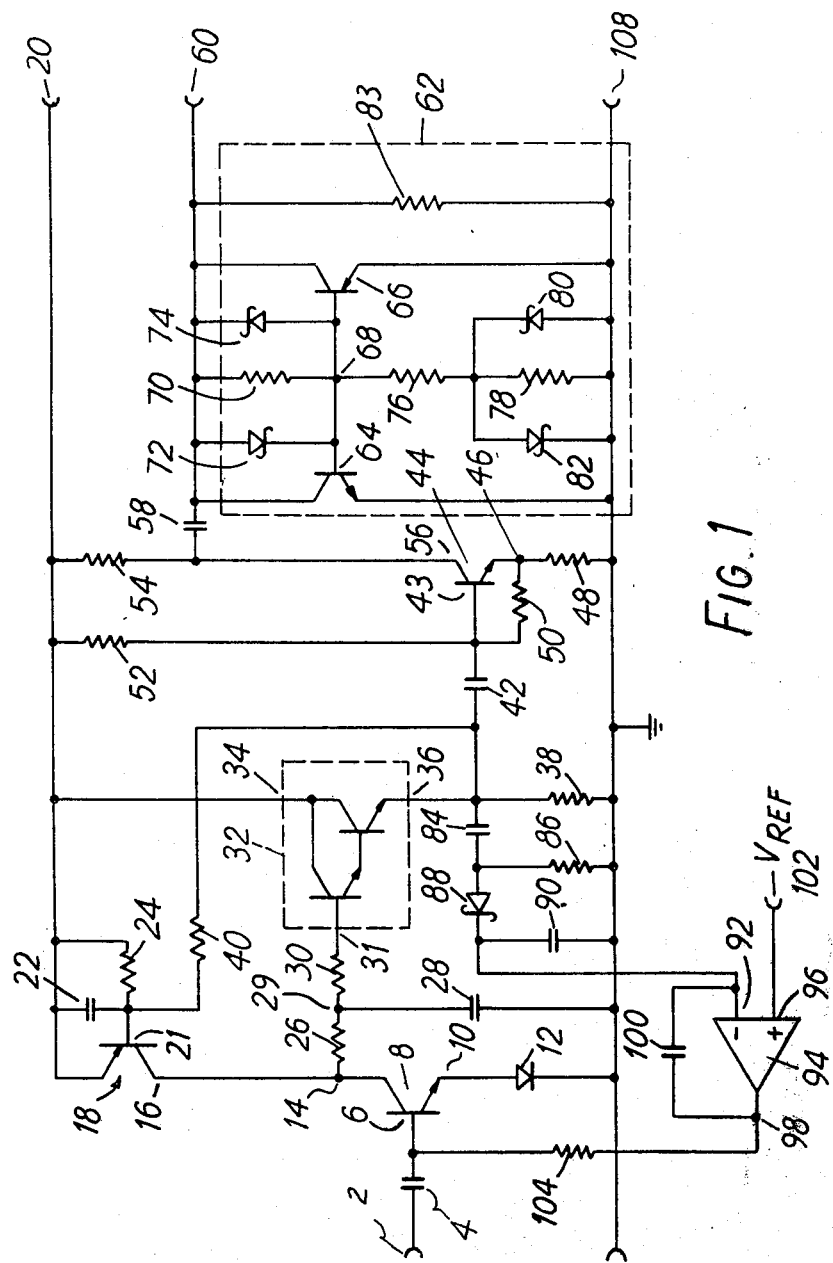

There is shown in FIG. 1 an input terminal 2 for receiving a square wave input signal, connected by a capacitor 4 to the base 6 of a transistor 8 the emitter 10 of which is connected via a series diode 12 to ground. The collector 14 of transistor 8 is connected to the collector 16 of a transistor 18 the emitter of which is connected to a power supply 20 and the base 21 of which is connected to power supply 20 via a parallel capacitor 22 and a resistor 24. Collector 14 is connected via a resistor 26 to an integrating capacitor 28 the other terminal of which is connected to ground. The common point 29 of capacitor 28 and resistor 26 is connected via a resistor 30 to the base 31 of a Darlington pair 32 the collector 34 of which is connected to supply 20 and whereof the emitter 36 is connected via a resistor 38 to ground.

Emitter 36 is also connected via a resistor 40 to the base 21 of the transistor 18 and via a coupling capacitor 42 to the base 43 of a transistor 44. The emitter 46 of transistor 44 is connected via a resistor 48 to ground; a resistor 50 is connected between its base 43 and emitter 46. A resistor 52 is connected between base 43 and supply 20 and a resistor 54 is connected between collector 56 of transistor 44 and supply 20.

Collector 56 is connected by a coupling capacitor 58 to an output terminal 60; a non-linear network 62 is connected between output terminal 60 and ground. The network 62 comprises an NPN transistor 64 and a PNP transistor 66 each respective transistor having its emitter connected to ground, its collector connected to output terminal 60 and its base connected to common point 68. Common point 68 is connected to an output terminal 60 via a resistor 70 which is in parallel with reversely connected Schottky diodes 72 and 74. Common point 68 is connected to ground via series resistors 76 and 78; two Schottky diodes, 80 and 82, are reversely connected in parallel across resistor 78 each having one terminal connected to ground. A resistor 83 is connected between the output terminal 60 and ground.

The emitter 36 of Darlington pair 32 is connected by a coupling capacitor 84 to the junction of a resistor 86, the other terminal of which is connected to ground, and a Schottky diode 88; the other terminal of diode 88 is connected via a capacitor 90 to ground and to the inverting input 92 of an amplifier 94 which has a non-inverting input 96 and an output terminal 98. A capacitor 100 is connected between inverting input 92 and output 98 and input 96 is connected to a source of reference potential $V_{ref}$ 102. Output 98 is connected via a resistor 104 to the base 6 of transistor 8.

It will by seen that transistor 18 is connected to act as a current mirror for transistor 8 and thereby to provide a high source impedence for driving current pulses into capacitor 28 which integrates these square pulses to provide a triangular waveform. Darlington pair 32 is arranged to provide a low impedance output at point 36 representative of the triangular waveform appearing across capacitor 28. A feedback loop is established via capacitor 84, diode 88, amplifier 94 and resistor 104 responsive to the peak value of the signal at emitter 36; this peak value is compared with $V_{ref}$ 102 and amplifier 94 adjusts the current gain of transistor 8 and hence the amplitude of current pulses delivered to integrating capacitor 28 so as to maintain constant the peak value of the signal at emitter 36 over an extended frequency range of pulses applied at input 2. Diode 88 is temperature responsive so that the amplitude of the triangular wave signal at emitter 36 is reduced slightly with increasing temperature. This has the effect of reducing the drive voltage applied to network 62 and so compensating for the temperature co-efficient of dynamic resistance of network 62.

Transistor 44 acts as a driver circuit for network 62, to which it is connected by a coupling capacitor 58. The network 62 is symmetrical in operation, its resistance at the origin being determined by series resistors 70, 76 and 78, the dynamic resistance becoming progressively less as, first, one of diodes 80 or 82, depending on the polarity of the output signal at 60, and then one of diodes 72 or 74, conducts; finally one of transistors 64 or 66 becomes progressively more conductive further reducing the dynamic resistance of the function generator at the limits of its predetermined range.

There is shown in FIG. 2(a) a square wave representing the input signal applied to input point 2 and the current pulses delivered from collector 14 to capacitor 28.

FIG. 2(b) shows the triangular voltage waveform appearing across capacitor 28 as a result of integration of the square current pulses. The same waveform represents the voltage at emitter 36 and the current in transistor 44.

FIG. 2(c) shows the voltage waveform appearing at output 60, the current waveform of FIG. 2(b) having been modified by the non-linearities of network 62.

FIG. 3 illustrates characteristics of the network 62; FIG. 3(a) shows the dynamic resistance of network 62 which is very small for large excursions of positive or negative current when one of transistors 64 and 66 is conducting, but relatively large at small currents where it corresponds to the value of resistances 70, 76, 78 in series.

FIG. 3(b) shows the transfer characteristic between the output V appearing at point 60 and the input current waveform delivered from collector 56. It will be appreciated that for the triangular wave of FIG. 2(b) to be converted to the sinusoidal form of FIG. 2(c) the transfer characteristic of FIG. 3(b) should correspond in shape to Sin x over the range $$-\frac{\pi}{2} \quad \text{to} \quad +\frac{\pi}{2}$$

and that of FIG. 3(a) to Cos x over the same range.

The amplitude of the signal applied to network 62, which is dependent on the amplitude of the signal at emitter 36 of Darlington pair 32, is set by the voltage reference 102 so that peak to peak excursions of the input signal kx to the network 62 correspond to values of x from $$-\frac{\pi}{2} \quad \text{to} \quad +\frac{\pi}{2}$$

in FIG. 3.

What is claimed is:

1. A symmetrical non-linear two-terminal network for use in a function generator to convert a bipolar triangular wave of predetermined amplitude into a sine wave, the network comprising
   a first terminal,
   a second terminal, first and second transistors each having an emitter, a collector and a base, the respective emitter-collector paths of the two transistors being connected in parallel with each other between the first terminal and the second terminal.
   a first non-linear circuit coupled between the base and the collector of the first transistor, and
   a second non-linear circuit coupled between the base and the collector of the second transistor, whereby one of the transistors becomes progressively more conductive as input signals of one polarity applied between the two terminals exceed a predetermined magnitude, and the other transistor becomes progressively more conductive as input signals of the other polarity applied between the two terminals exceed said predetermined magnitude,
   each non-linear circuit comprises a respective diode adapted to conduct at a lower forward voltage than that of the base emitter junction of the respective transistor.

2. A network according to claim 1 wherein each of said diodes is a Schottky diode.

3. A function generator for converting square waves to sine waves comprising
   integrating means for converting a square wave input signal to a triangular wave signal,
   a symmetrical non-linear two-terminal network to convert a bipolar triangular wave of predetermined amplitude into a sine wave, the network comprising
   a first terminal,
   a second terminal,
   first and second transistors each having an emitter, a collector and a base, the respective emitter-collector paths of the two transistors being connected in parallel with each other between the first terminal and the second terminal,
   a first non-linear circuit coupled between the base and the collector of the first transistor, and
   a second non-linear circuit coupled between the base and the collector of the second transistor, wherby one of the transistors becomes progressively more conductive as input signals of one polarity applied between the two terminals exceed a predetermined magnitude, and the other transistor becomes progressively more conductive as input signals of the other polarity applied between the two terminals exceed said predetermined magnitude; and means for applying the triangular signal to the non-linear network to yield a sinusoidal output signal wherein the integrating means comprises a switching transistor adapted to be switched by the square wave input signal, an integrating capacitor connected to receive current pulses from said switching transistor to produce a triangular wave signal, a source of reference signal and a feedback circuit adapted to receive a signal representative of the amplitude of the triangular wave signal and the reference signal and to provide an output for adjusting the amplitude of the current pulses supplied by the switching transistor to maintain substantially constant the amplitude of the triangular wave signal prior to its application to the non-linear network.

4. A function generator according to claim 3 wherein the amplitude of current pulses supplied by the switching transistor is varied by varying the bias current into the base of the transistor.

5. A function generator according to claim 3 wherein the integrating means further comprises temperature compensating means for adjusting the amplitude of the trangular wave signal according to temperature so as to compensate for variations with temperature of the dynamic resistance presented by the network.

6. A function generator according to claim 5 wherein the temperature compensating means comprises a semi-conductor diode disposed in a rectifying circuit adapted to receive the triangular wave signal and to produce an output representative thereof.

7. A function generator according to claim 3 further comprising a current mirror circuit which includes a transistor having a collector which is connected by a circuit path to the collector of the switching transistor wherein the current drawn by the current mirror circuit is varied by adjusting the bias to the transistor therein so as to maintain substantially constant the mean voltage at the collector of the switching transistor.

8. A network according to claim 3, further comprising a third non-linear circuit connected between the base and the emitter of the first transistor, and a fourth non-linear circuit connected between the base and the emitter of the second transistor.

9. A network according to claim 3, wherein said first and second transistors are of complementary types.

10. A network according to claim 3 wherein each non-linear circuit comprises a respective diode adapted to conduct at a lower forward voltage than that of the base emitter junction of the respective transistor.

11. A network according to claim 10 wherein each of said diodes is a Schottky diode.

* * * * *